United States Patent
Haba et al.

(10) Patent No.: US 9,153,533 B2
(45) Date of Patent: Oct. 6, 2015

(54) MICROELECTRONIC ELEMENTS WITH MASTER/SLAVE CONFIGURABILITY

(71) Applicant: Invensas Corporation, San Jose, CA (US)

(72) Inventors: Belgacem Haba, Saratoga, CA (US); David Fisch, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 286 days.

(21) Appl. No.: 13/800,313

(22) Filed: Mar. 13, 2013

(65) Prior Publication Data

US 2014/0264730 A1    Sep. 18, 2014

(51) Int. Cl.

| | |
|---|---|
| *G06F 13/00* | (2006.01) |
| *G06F 13/36* | (2006.01) |
| *G11C 5/06* | (2006.01) |
| *H01L 23/525* | (2006.01) |
| *H01L 27/06* | (2006.01) |
| *G11C 5/02* | (2006.01) |
| *G11C 7/10* | (2006.01) |

(Continued)

(52) U.S. Cl.
CPC .............. *H01L 23/5256* (2013.01); *G11C 5/02* (2013.01); *G11C 7/10* (2013.01); *G11C 7/20* (2013.01); *H01L 27/06* (2013.01); *H01L 24/06* (2013.01); *H01L 24/16* (2013.01); *H01L 2224/0401* (2013.01); *H01L 2224/05009* (2013.01); *H01L 2224/0557* (2013.01); *H01L 2224/06181* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2225/06565* (2013.01); *H01L 2924/00014* (2013.01)

(58) Field of Classification Search
CPC ................. H01L 25/0657; H01L 2224/16145; H01L 2225/06541; G11C 7/10
USPC ..................... 710/110, 315; 365/63
See application file for complete search history.

(56) References Cited

U.S. PATENT DOCUMENTS

| | | | | |
|---|---|---|---|---|
| 5,434,983 | A | * | 7/1995 | Yaso et al. ................... 710/110 |
| 5,878,234 | A | * | 3/1999 | Dutkiewicz et al. .......... 710/110 |
| 6,208,548 | B1 | * | 3/2001 | Kawagoe ........................ 365/63 |

(Continued)

FOREIGN PATENT DOCUMENTS

| | | | | | |
|---|---|---|---|---|---|
| CN | 103064817 | A | * | 4/2013 | .............. G06F 13/42 |
| JP | 06012385 | A | * | 1/1994 | .............. G06F 15/16 |

(Continued)

OTHER PUBLICATIONS

International Search Report and Written Opinion for Application No. PCT/US2014/025620 dated Sep. 26, 2014.

*Primary Examiner* — Faisal M Zaman
(74) *Attorney, Agent, or Firm* — Lerner, David, Littenberg, Krumholz & Mentlik, LLP

(57) ABSTRACT

A semiconductor chip that may be configured to function as either a master chip or a slave chip. The semiconductor chip may be included in a microelectronic assembly including a plurality of vertically stacked semiconductor chips, with each of the chips containing functional circuit blocks that enable each semiconductor chip to function as either a master chip or a slave chip under in accordance with a state input stored on the same chip, or received from another chip in the stacked assembly or from another component of a system in which the stacked assembly is configured to operate.

16 Claims, 4 Drawing Sheets

(51) Int. Cl.
*G11C 7/20* (2006.01)
*H01L 23/00* (2006.01)

(56) References Cited

U.S. PATENT DOCUMENTS

| | | | | |
|---|---|---|---|---|
| 6,567,881 | B1* | 5/2003 | Mojaver et al. | 710/313 |
| 7,020,834 | B2* | 3/2006 | Chiang et al. | 714/799 |
| 2003/0151939 | A1* | 8/2003 | LaBerge | 365/63 |
| 2004/0028086 | A1* | 2/2004 | Ghiasi et al. | 370/536 |
| 2005/0010712 | A1* | 1/2005 | Kim et al. | 710/315 |
| 2005/0273539 | A1* | 12/2005 | Yamamoto | 710/110 |
| 2005/0289269 | A1* | 12/2005 | Nakayama et al. | 710/110 |
| 2007/0136502 | A1* | 6/2007 | Wen et al. | 710/110 |
| 2009/0039915 | A1 | 2/2009 | Ruckerbauer et al. | |
| 2011/0082956 | A1* | 4/2011 | Kazama | 710/110 |
| 2011/0292708 | A1 | 12/2011 | Kang et al. | |
| 2012/0294059 | A1* | 11/2012 | Oh et al. | 365/63 |
| 2012/0311211 | A1* | 12/2012 | Gao | 710/110 |
| 2013/0138879 | A1* | 5/2013 | Kulkarni | 711/114 |
| 2014/0160867 | A1* | 6/2014 | Veches et al. | 365/189.011 |

FOREIGN PATENT DOCUMENTS

| | | | | |
|---|---|---|---|---|
| KR | 950012509 | B1* | 10/1995 | G06F 13/36 |
| KR | 20130131627 | A* | 12/2013 | G11C 8/18 |

* cited by examiner

MICROELECTRONIC ELEMENTS WITH MASTER/SLAVE CONFIGURABILITY

BACKGROUND OF THE INVENTION

Microelectronic devices commonly contain a plurality of semiconductor chips. These chips often have a flat, rectangular body with a large front face having contacts connected to the internal circuitry of the chip. Each individual chip may be contained in a package having external terminals which, in turn, are electrically connected to a circuit panel such as a printed circuit board and which connects the contacts of the chip to conductors of the circuit panel. Alternatively, the chips may be stacked upon one another in an electrically connected assembly, so as to limit the footprint of chips on the circuit board.

It is common for the plurality of semiconductor chips to act in concert as an array of semiconductor chips, with one of the semiconductor chip acting as a master chip to control the transmission of data to and from the other slave chips. These master chips contain circuitry that is not present in the slave chips, such as serializer/deserializers for controlling the flow of input/output signals. Accordingly, in these assemblies only the master chip may perform the operations required of the master chip. If that particular chip ceases to function properly, the entire array of semiconductor chips may be rendered inoperable.

SUMMARY OF THE DISCLOSURE

In one aspect of the disclosure, a semiconductor chip may include a plurality of data lines connectable to an off-chip data bus for transmitting data signals between the semiconductor chip and at least one other semiconductor chip. The semiconductor chip may also include chip select control for designating the semiconductor chip as a master chip or as a slave chip, as well as master chip circuitry configured to perform operations as a master chip in a state in which the chip select control designates the semiconductor chip as a master chip. The master chip circuitry may include circuits for converting between a first format of first data signals on the data lines or on the data bus and a second format of second data signals at an external data input-output interface of the semiconductor chip. The master chip circuitry may include a serializer/deserializer ("SerDes") configured to convert between the first data signals and second data signals, the second data signals being serialized from the first data signals, the first data signals being deserialized from the second data signals.

In accordance with another aspect, the semiconductor chip may be a DRAM chip, and the off-chip data bus may be a TSV bus.

In accordance with yet another aspect, the chip may include a fuse having at least two states, and wherein the chip select control is configured to be enabled or disabled in accordance with the at least two states of the fuse. In addition, a state of the fuse may be configured to be altered between the at least two states by electrical signal or laser light.

In accordance with still another aspect, the chip select control may be configurable in accordance with a signal from a microcontroller.

In accordance with another aspect, the semiconductor chip further includes a switch. When chip select control designates the semiconductor chip as a master chip, a data line of the plurality of data lines may be connected with the master chip circuitry by the switch, and when chip select control does not designate the semiconductor chip as a master chip, a data line of the plurality of data lines may be disconnected from the master chip circuitry by the switch. The switch may be a plurality of switches corresponding to each of the plurality of data lines.

In accordance with yet another aspect, the external input-output interface may be connected to an input-output bus that is distinct from the data bus. When the semiconductor chip is designated as a slave chip, the input-output interface may be set to a high impedance or a termination impedance may be applied to the input-output interface.

In accordance with still another aspect, a microelectronic assembly may include a plurality of semiconductor chips electrically interconnected with one another directly through a data bus. Each semiconductor chip may be configurable as either a master chip or a slave chip. In addition, each chip may have a chip select control having a first state and a second state. When the chip select control of a first chip of the plurality of semiconductor chips is in the first state, the first chip is configured to perform master chip operations, and when the chip select control of the first chip is in the second state, the first chip is not configured to perform master chip operations. The master chip operations may include converting between a first format of first data signals on the data bus and a second format of second data signals at an external data input-output interface of the first semiconductor chip.

In accordance with yet another aspect, upon the chip select control transferring from the second state to the first state, a second chip, from the plurality of semiconductor chips, may cease to perform master chip operations.

In accordance with another aspect, the master chip circuitry may include a SerDes configured to convert between the first data signals and second data signals, the second data signals being serialized from the first data signals, the first data signals being deserialized from the second data signals.

In accordance with still another aspect, upon the chip select control transferring from the first state to the second state, the first chip may cease sending signals to a portion of the first chip responsible for performing master chip operations.

DETAILED DESCRIPTION

Figure 1:
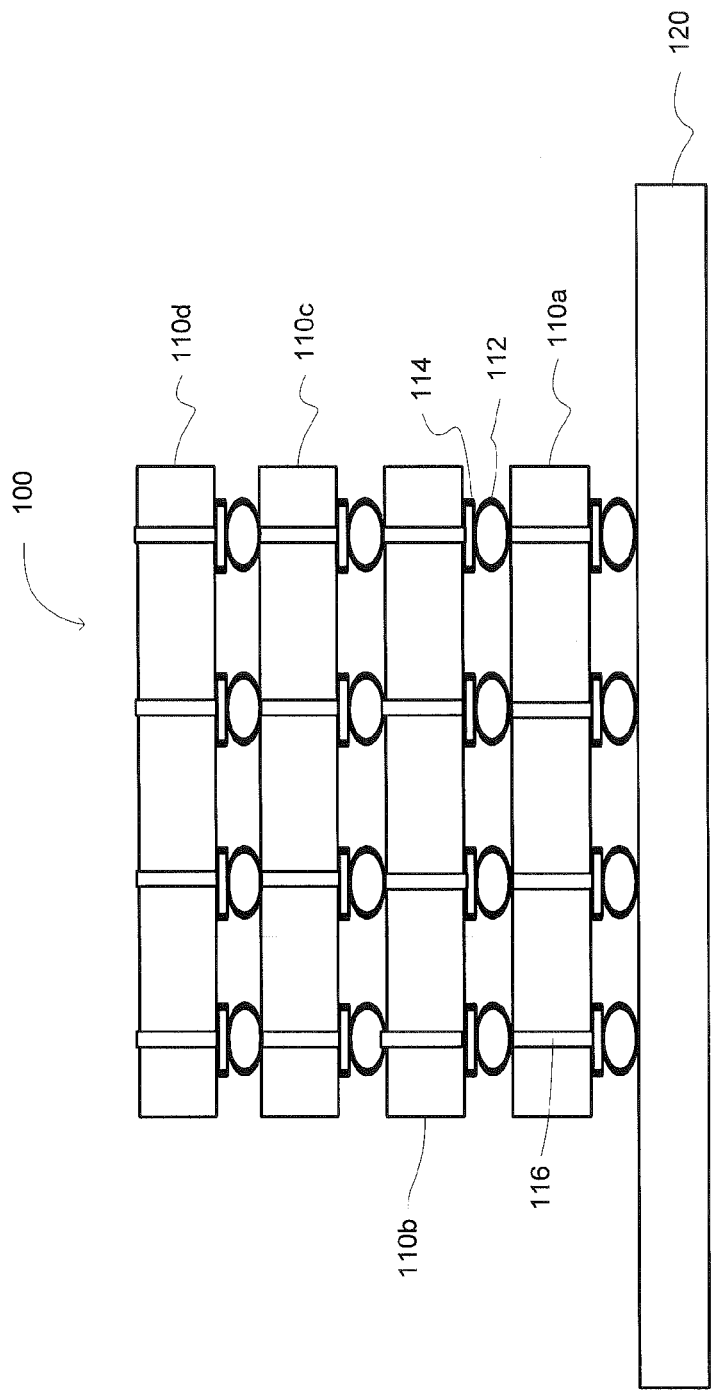
FIG. 1 is a sectional view illustrating a microelectronic element in accordance with aspects of the disclosure.

FIG. 1 illustrates an exemplary microelectronic assembly that includes four stacked semiconductor chips 110a-d or "chips". Each chip 110 may be electrically connected to another chip 110 in the stack by conductive contacts 112, conductive bond material 114, and through silicon vias or through vias, (hereinafter, "TSVs" 116). The stack of chips 110a-d may or may not be further electrically connected with a substrate 120, such as a substrate of a package for interconnecting the package with a circuit panel (not shown). Chips 110a-d may perform any number of functions that allows for a master/slave relationship between the chips. For example, each of chips 110a-d may be a memory storage array chip or may contain one or more memory storage arrays. In one example, each chip can be a dynamic random access memory ("DRAM") chip. In a particular example, each chip 110 may be a high-density memory chip, such as a double data rate three synchronous dynamic random access memory ("DDR3 SDRAM").

Figure 2:
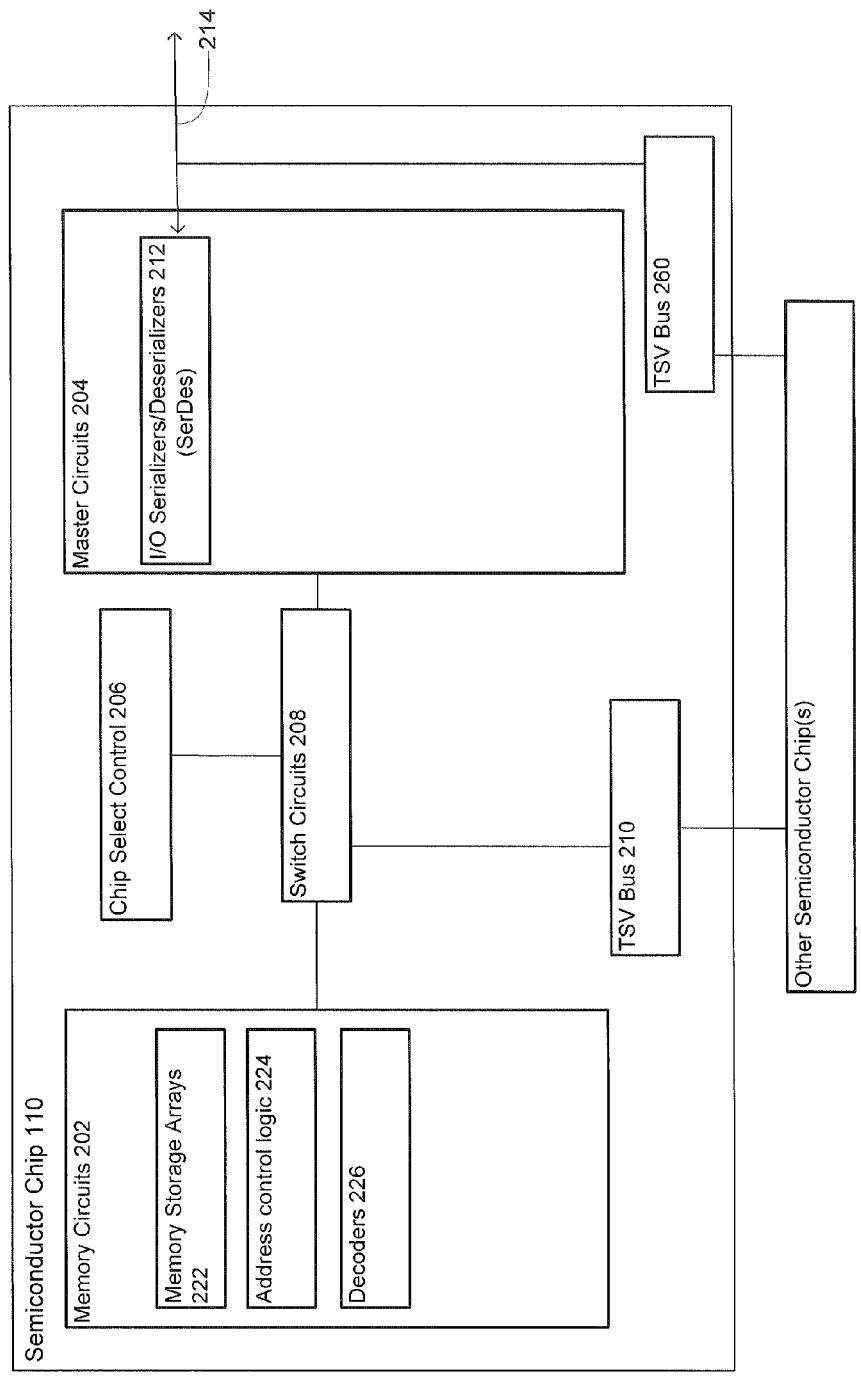
FIG. 2 is block diagram illustrating the circuits of a microelectronic chip in accordance with aspects of the disclosure.

FIG. 2 illustrates a chip 110 in accordance with one aspect of the disclosure. In particular, chip 110 may include certain functional blocks such as memory circuits 202, master circuits 204, chip select control 206, and switches 208, all of which are electrically connected to a TSV bus 210. While connections between each functional block are depicted by single lines in FIG. 2, it should be appreciated that multiple lines of connection may exist between connected circuit blocks. For example, TSV bus 210 may be an off-chip or "inter-chip" data bus that includes numerous data lines used to directly connect with corresponding sets of internal data lines on each of the memory chips in the stacked assembly 100 (FIG. 1) and with corresponding internal data lines on a second memory chip and other like memory chips in the stacked assembly 100. The TSV bus 210 is connectable through switches 208 (FIG. 2), 302 (FIGS. 3, 4) for transmitting to and receiving data from master circuits 204 of a chip 110 designated within the stacked assembly as a "master" chip. As set forth herein, the terms "connect," "connected," "connectable," and "connection" may refer to any direct or indirect coupling of two or more components. Accordingly, a first component and second component may be connected to one another via a third component.

Master circuits 204 include circuitry necessary for chip 110 to act as a master chip, so as to control the data flow between an external data input output interface 214 and the TSV bus 210. For example, master circuits 204 may include I/O serializers/deserializers 212 (hereinafter, "SerDes circuits"). The master circuits 204 and SerDes circuits, for example, when active, can be used to convert between a first format of data signals on data lines within the chip or on the inter-chip data bus, and a second format of data signals at any external data input-output interface 214 of the chip 110. Such external data input-output interface can comprise the "DQ" interface of chip 110 used for transferring data to and from chip 110 designated as a master and a circuit panel or circuit board such as through a set of corresponding package terminals on substrate 120, for example. Memory circuits 202 include circuitry necessary to perform the read/write commands of a DRAM chip. For example, memory circuits 202 may include one or more memory storage arrays 222 for data storage, address control logic 224 for reading from and writing to memory storage arrays 222, and decoders 226.

In accordance with one aspect of the disclosed chip, chip select control 206 may be used to designate chip 110 as either a master chip or a slave chip. For example, chip select control 206 may receive a state input M from a permanent fuse (not shown), that when in a first state, allows chip 110 to perform functions of a master chip. Conversely, when the permanent fuse is in a second state, chip 110 will only act as a slave chip, in that master circuits 204 will be disabled. In yet another example, the state of the chip select control 206 can be controlled by a reconfigurable element on the chip such as a nonvolatile memory whose stored state can be changed any number of times. In this way, the designation of chip 110 may be changed from a slave chip to a master chip, and vice versa, any number of times, including after chip 110 has been installed and used in an electronic device.

While the state input M used by chip select control 206 to control whether a given chip functions as a master or slave can be stored on each chip 110 individually, that state input M can be stored elsewhere. For example, another element within the microelectronic assembly 100 illustrated in FIG. 1, e.g., a fuse array, or nonvolatile memory on a chip other than memory chips 110, can store the corresponding state inputs M for each of the memory chips 110 within the microelectronic assembly 100. In another example, the state inputs M can be stored in a fuse array, or nonvolatile memory on a chip connected to a module card or circuit panel, e.g., "motherboard" of a system to which the microelectronic assembly is to be connected or is connected.

Chips 110 of microelectronic assembly 100 shown in FIG. 1 may be connected to each other by busses, such as TSV bus 210 shown in FIG. 2, that connect internal data bus lines. In addition, assembly 100 may also contain busses to interconnect chip select control signals, addresses, and data terminals of each chip 110.

In one embodiment, only the master chip of assembly 100 may have an enabled connection with substrate 120. For example, if chip 110a of FIG. 2 is dedicated as a master chip, chip 110a may be the only chip that actively connects its master circuits 204 to the substrate 120. In this way, the parasitic load on the high-frequency terminals to substrate 120 may be reduced. In an instance where any single chip 110a-d within microelectronic assembly 100 can be designated as a master chip, each of their data terminals may be coupled to an external bus for driving data to substrate 120. For example TSV bus 260 of FIG. 2 may connect chip 110a to substrate 120 shown in FIG. 1.

In this embodiment, chips 110 of assembly 100 that have been designated as slave chips may have their master circuits 204 disabled with respect the internal data busses and in addition may have their master circuits 212 placed in an inactive mode in relation to TSV bus 260. For example, a slave chip 110 may disable its master circuit 204 from TSV bus 260 by entering a high impedance mode, in which a high impedance is applied to the connection between master circuit 204 and TSV bus 260. Alternatively, a slave chip 110 may enter an output termination mode in which a termination impedance is applied to the input-output interface 214 by master circuits 204, for example. In this way, only the master chip will drive active data from the microelectronic assembly 100.

In one embodiment, a single element or chip within a system can designate each of the chips either a master chip or slave chip within a particular microelectronic assembly 100, or within a plurality of microelectronic assemblies.

If chip select control 206 is configured so that chip 110 is to act as a master chip, a group of switch circuits connects a corresponding set of internal data signal lines and the data signal lines of the TSV bus with the master circuits 204. In the example depicted in FIG. 3, a group of 128 switch circuits 208 connects a corresponding group of 128 internal data signal lines Di(127:0) and the 128 signal lines of TSV bus 210 with master circuits 204 when Ck is enabled during a read or write operation with respect to a chip 110 of the microelectronic assembly 100. Conversely, when chip select control 206 is disabled so that chip 110 is configured to act as a slave chip, switch circuits 208 will disconnect the corresponding group of data 128 signal lines Di(127:0) and the 128 signal lines of the TSV bus 210 from master circuits 204.

Figure 3:
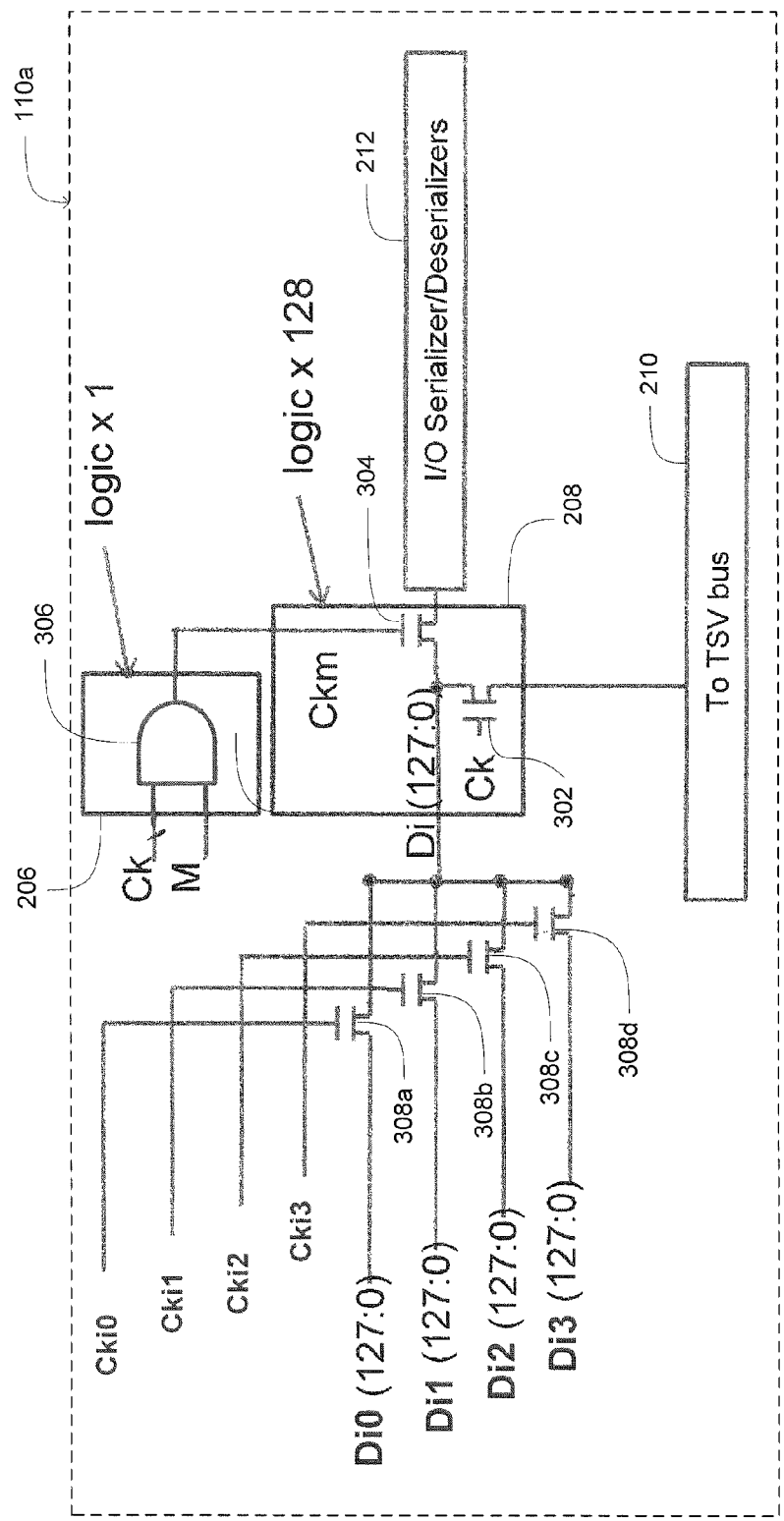
FIG. 3 is a functional block diagram illustrating switch circuits in accordance with aspects of the disclosure.

FIG. 3 illustrates an embodiment of switch circuits 206 within chip 110a. As previously shown in FIG. 1, chip 110a may be a part of a microelectronic assembly that includes a plurality of vertically stacked chips 110a-d electrically interconnected by TSVs 116. One of these chips may be designated as a master chip. In accordance with the functional diagram of FIG. 3, each switch 304 disconnects a data signal Di(127:0) of a particular chip i from master circuits including Serializer/Deserializer 212 of chip 110a, when chip 110a has not been designated as the master chip.

The output of chip select control 206, shown illustratively as "AND" gate 306 in FIG. 3, controls switch 304. Specifically, switch 304 will remain disabled until chip select control 206 enables switch 304, which connects the particular data line Di with the SerDes circuits 112. The two inputs to chip select control 206 are marked "$C_k$" and "M." The $C_k$ input will be enabled, e.g., at a high voltage, when any read or write command is sent to any chip 110a-d in the stack. As described above, the M input of logic gate 306 will be disabled, e.g., at a low voltage, unless chip 110a has been designated as a master chip. Accordingly, switch 304 will not be enabled for any read or write command unless chip 110a has been designated as a master chip.

The $C_k$ input for switch 302 will enable (turn on) switch 302 for any read or write command sent to any chip 110a-d in the stack. In a particular example, the read or write command may then propagate to switches 308a-d. Switches 308a-d are each controlled by an input $C_{kij}$, where "j" may represent different memory banks within chip "i" to which the read or write command may be addressed. For example, switch 308a will only enable, and thereby connect a data line of the TSV bus with a corresponding global data line of a chip, when the read or write command is addressed to memory bank "0" of chip "i". In this way, the read write commands may propagate to the correct memory bank of the appropriate chip. While four switches 308a-d are illustrated, it should be appreciated that chip 110a may contain fewer or more switches 308, depending on the number of memory banks that exist within chip 110a.

Figure 4:
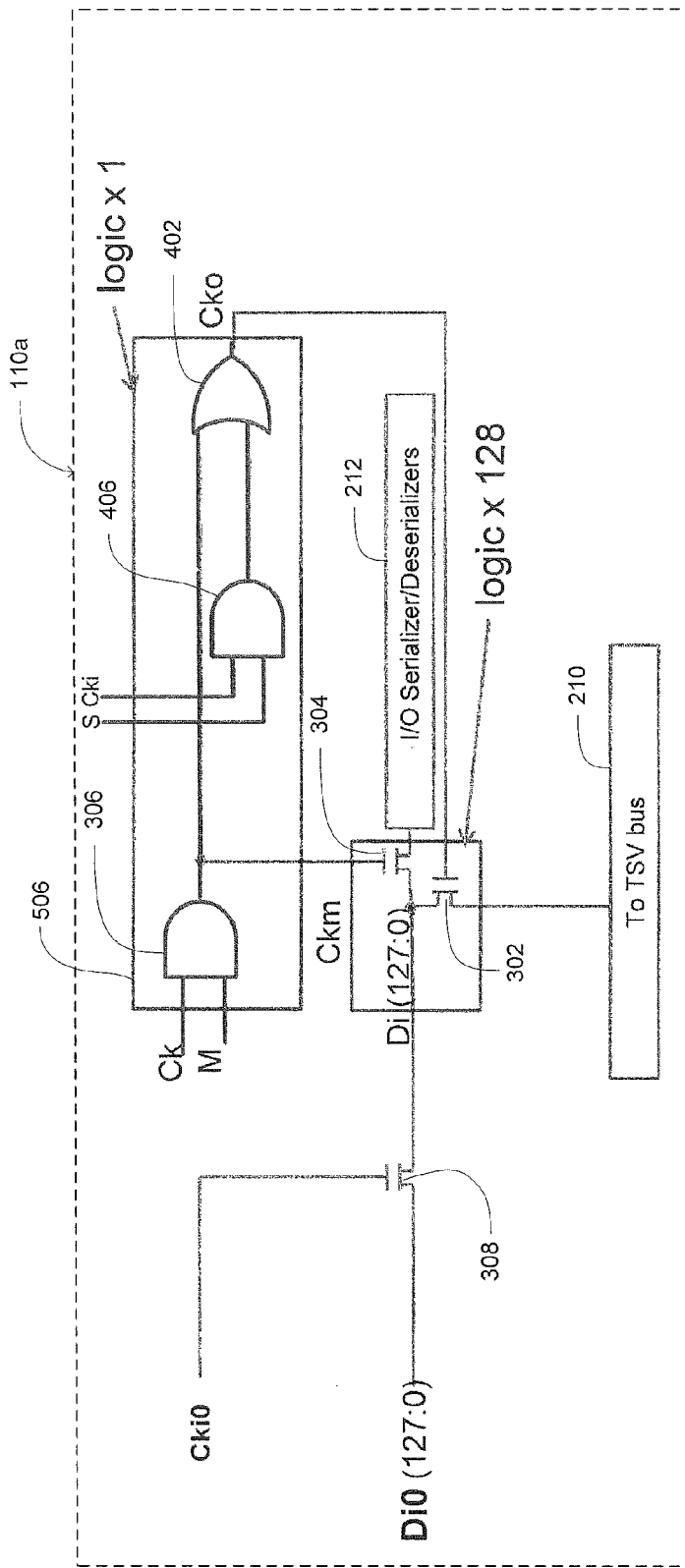
FIG. 4 is a functional block diagram illustrating further switch circuits in accordance with aspects of the disclosure.

An alternative embodiment for chip select control 506 of FIG. 2 is shown in FIG. 4. In this embodiment, switch 302 is controlled by the output "$C_{ko}$" of the "OR" logic gate 402. The inputs of logic gate 402 are outputs of the "AND" logic gates 306 and 406. As described above in connection with FIG. 3, "$C_k$" will be enabled when any read or write command is active, regardless of the chip to which the command is addressed. In contrast, input "$C_{ki}$" for logic gate 406 is enabled only when there is a read or write command addressed to one of the memory banks within selected chip "i". Input "M" for logic gate 306 will be enabled if chip 110a has been designated as the master chip, while input "S" for logic gate 406 will be enabled if chip 110a has been designated as a slave chip. Accordingly, if chip 110a is designated as a master chip, output "$C_{ko}$" for logic gate 402 will enable switch 302 when any read or write command is addressed to any chip in the microelectronic assembly 100. However, when chip 110a is designated as a slave chip, output Cko will only enable switch 302 if the read or write command is addressed to chip 110a. In this way, the load on TSV bus from the data lines is reduced, when compared with the embodiment shown in FIG. 3 in which all of the data lines Di on all chips have a connection from switches 308 to the TSV bus whenever a read or write command is active.

For simplicity of illustration, FIG. 4 shows only one switch 308, however like switches 308a-d of FIG. 3, chip 110a of FIG. 4 may have as many switches 308 as is required for the memory banks contained within chip 110a. Switch 308 will close and connect an internal data line of a particular slave chip of the microelectronic assembly with a corresponding data line of the TSV bus only when input "$C_{kij}$" indicates that the read or write command is addressed to memory bank "j" of chip "i".

All of the chips 110a-d of FIG. 1 may contain the functional blocks shown in FIG. 2. Accordingly, there is no need for stack 100 to contain a specially created master chip that contains different functional blocks than the other chips, as each chip 110a-d may be designated as the master chip at any particular time. For example, chip 110a may originally be designated as the master chip by configuring chip select circuits 206 of chip 110a to a state indicative of a master chip. If a problem arises with its master circuits 204, in one example, chip 110a may be changed from a master chip to a slave chip, and chip 110b may be changed from a slave chip to the master chip. Therefore, chip 110a would disconnect its own internal data lines and its own connections to the TSV bus from the master circuits 204, e.g., SerDes circuits 212 on chip 110a. Master circuits 204 of chip 110b would be connected to the data lines and TSV bus of the stacked assembly.

The switches shown in FIGS. 3 and 4 are not limited to a particular construction, as any structure capable of performing the function of enabling and disabling connections between two nodes may be used. For example, while chips 110 shown in FIGS. 3 and 4 may contain NMOS, PMOS, or CMOS switches, chip 110 is not limited to these particular structures.

If chip select circuits 206 for chips 110a-b included a permanent fuse, the state of the permanent fuses may be altered by applying a laser or electrical signal to the permanent fuse. For example, a laser light may be applied to the permanent fuse of a chip 110 to change the chip 110 from a slave chip to a master chip, or vice versa.

While FIG. 1 shows chips 110a-d as being configured in a stack 100 having electrical connections through TSVs, chips 110a-d may be arranged in any configuration suitable for the functions to be performed by chips 110a-d. Alternatively, chip 110a shown in FIG. 2 may function as a single semiconductor chip. Moreover, in any of the embodiments described in the foregoing, the semiconductor chips may be implemented in any suitable memory technology and is not limited to DRAM or any specific standard relating to DRAM.

Various features of the above-described embodiments of the invention can be combined in ways other than as specifically described above without departing from the scope or spirit of the invention. It is intended for the present disclosure to cover all such combinations and variations of embodiments of the invention described above.

The invention claimed is:
1. A semiconductor chip comprising:
a plurality of data lines connectable to an off-chip data bus for transmitting data signals between the semiconductor chip and at least one other semiconductor chip;
a chip select control for designating the semiconductor chip as a master chip or as a slave chip; and
master chip circuitry configured to perform operations as a master chip in a state in which the chip select control designates the semiconductor chip as a master chip, the master chip circuitry including circuits for converting between a first format of first data signals on the data lines or on the data bus and a second format of second data signals at an external data input-output interface of the semiconductor chip,
the semiconductor chip further comprising control logic coupled to receive an address and an output of the chip select control, and a set of switches coupled between the data bus and the data lines of such chip configured to enable the transfer of signals between the data bus and the data lines in a state in which the chip select control designates the semiconductor chip as a master chip; and when the chip select control designates the semiconductor chip as a slave chip, to enable the transfer of signals between the data bus and the data lines of the semiconductor chip only when the received address defines an address within the semiconductor chip.

2. The semiconductor chip of claim 1, wherein the master chip circuitry comprises a SerDes configured to convert between the first data signals and second data signals, the second data signals being serialized from the first data signals, the first data signals being deserialized from the second data signals.

3. The semiconductor chip of claim 1, wherein the semiconductor chip is a DRAM chip.

4. The semiconductor chip of claim 1, wherein the off-chip data bus is a TSV bus.

5. The semiconductor chip of claim 1, wherein the chip further comprises a fuse having at least two states, and wherein the chip select control is configured to be enabled or disabled in accordance with the at least two states of the fuse.

6. The semiconductor chip of claim 1, wherein a state of the fuse is configured to be altered between the at least two states by electrical signal or laser light.

7. The semiconductor chip of claim 1, wherein the chip select control is configurable in accordance with a signal from a microcontroller.

8. The semiconductor chip of claim 1, wherein the external input-output interface is connected to an input-output bus that is distinct from the data bus.

9. The semiconductor chip of claim 8, wherein when the semiconductor chip is designated as a slave chip, the input-output interface is set to a high impedance.

10. The semiconductor chip of claim 8, wherein when the semiconductor chip is designated as a slave chip, a termination impedance is applied to the input-output interface.

11. A microelectronic assembly comprising:
a plurality of semiconductor chips electrically interconnected with one another directly through a data bus, each semiconductor chip being configurable as either a master chip or a slave chip, each chip having:
a chip select control having a first state and a second state, wherein,
when the chip select control of a first chip of the plurality of semiconductor chips is in the first state, the first chip is configured to perform master chip operations, and
when the chip select control of the first chip is in the second state, the first chip is not configured to perform master chip operations,
the master chip operations including converting between a first format of first data signals on the data bus and a second format of second data signals at an external data input-output interface of the first chip,
and each of the semiconductor chips having control logic coupled to receive an address and an output of the chip select control of such chip, and a set of switches coupled between the data bus and data lines of such chip configured to enable the transfer of signals between the data bus and the data lines of such chip in a state in which the chip select control of such chip is in the first state and the received address defines an address within any of the plurality of semiconductor chips; and when the chip select control of such chip is in the second state, to enable the transfer of signals between the data bus and the data lines of such chip only when the received address defines an address within such chip.

12. The microelectronic assembly of claim 11, wherein the state of chip select control is controlled by a fuse.

13. The microelectronic assembly of claim 11, wherein upon the chip select control of the first chip transferring from the second state to the first state, a second chip, from the plurality of semiconductor chips, ceases to perform master chip operations.

14. The microelectronic assembly of claim 11, wherein the chip select control is configured to receive a state control signal from a microcontroller.

15. The microelectronic assembly of claim 11, wherein the master chip circuitry comprises a SerDes configured to convert between the first data signals and second data signals, the second data signals being serialized from the first data signals, the first data signals being deserialized from the second data signals.

16. The microelectronic assembly of claim 11, wherein, upon the chip select control of the first chip transferring from the first state to the second state, the first chip ceases sending signals to a portion of the first chip responsible for performing master chip operations.

\* \* \* \* \*